(12) United States Patent
Brady et al.

(10) Patent No.: US 7,495,526 B2
(45) Date of Patent: Feb. 24, 2009

(54) APPARATUS AND METHOD FOR REDUCING PROPAGATION DELAY IN A CONDUCTOR SYSTEM SELECTABLE TO CARRY A SINGLE SIGNAL OR INDEPENDENT SIGNALS

(75) Inventors: James Brady, Plano, TX (US); Duane Giles Laurent, Lewisville, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/997,089

(22) Filed: Nov. 23, 2004

(65) Prior Publication Data

US 2005/0093640 A1    May 5, 2005

Related U.S. Application Data

(60) Division of application No. 09/757,378, filed on Jan. 9, 2001, now Pat. No. 6,842,092, which is a continuation of application No. 09/127,050, filed on Jul. 31, 1998, now abandoned.

(51) Int. Cl.
*H01P 1/10* (2006.01)
*H01P 3/08* (2006.01)

(52) U.S. Cl. .......................... 333/101; 333/1
(58) Field of Classification Search .................. 333/1, 333/238, 101, 104, 109, 117
See application file for complete search history.

(56) References Cited

U.S. PATENT DOCUMENTS 3,659,227 A * 4/1972 Whistler ............... 333/103
3,678,415 A * 7/1972 Kuroda ................. 333/117
5,027,088 A   6/1991 Shimizu et al.
5,043,792 A   8/1991 Adachi
5,815,031 A   9/1998 Tan et al.

FOREIGN PATENT DOCUMENTS

| EP | 0 181 600 | 5/1986 |
| EP | 04073951 | 3/1992 |
| EP | 04142074 | 5/1992 |
| EP | 09237870 | 9/1997 |

\* cited by examiner

*Primary Examiner*—Benny Lee
(74) *Attorney, Agent, or Firm*—Lisa K. Jorgenson; William A. Munck

(57) ABSTRACT

An apparatus and method is provided that reduces the propagation delay in a conductor carrying an electrical signal from a first area of a circuit to a second area of the circuit. The conductor is fabricated to include a first conductor extending from the first area to the second area. The conductor also includes a second conductor extending substantially parallel and along the first conductor and electrically connected to the first conductor. A third and additional conductors may also be used which extend substantially parallel and along the first conductor and are electrically connected to the first conductor. The additional second conductor (and any additional conductors) reduces the capacitance of the conductor thereby reducing the propagation delay in the conductor (increasing the speed of the signal). The additional conductor(s) effectively "shield" the first conductor from some capacitance that the first conductor would normally "see" without the use of such additional conductors.

7 Claims, 5 Drawing Sheets

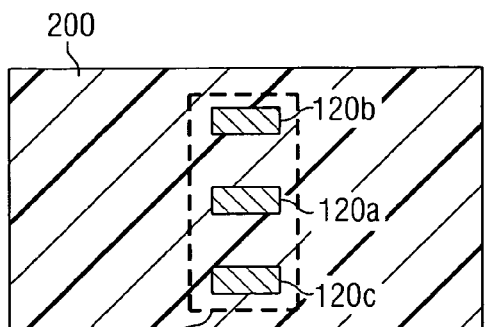
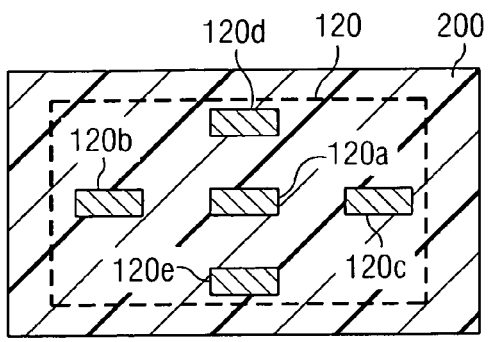
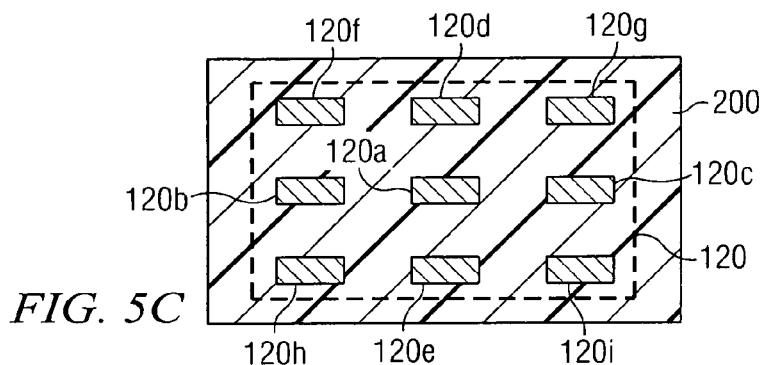
FIG. 5A  FIG. 5B  FIG. 5C
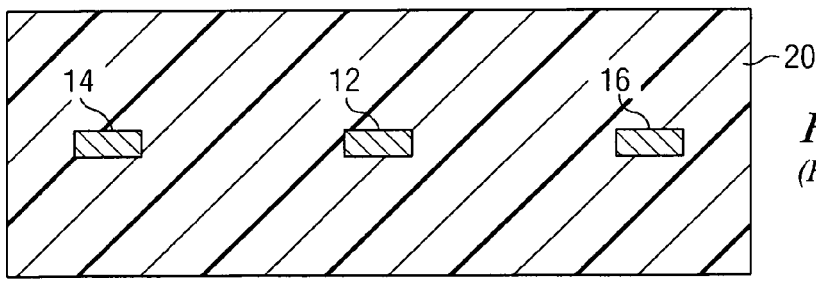
FIG. 6B
(PRIOR ART)
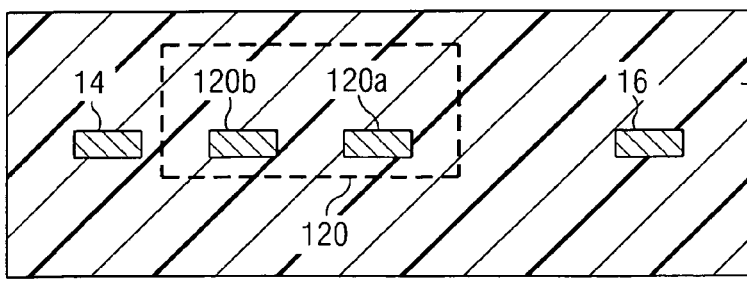
FIG. 6C
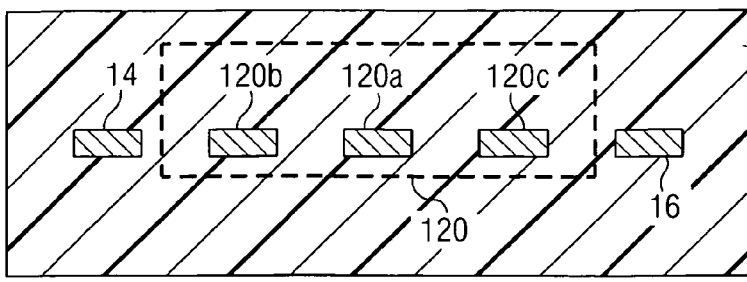
FIG. 6D

APPARATUS AND METHOD FOR REDUCING PROPAGATION DELAY IN A CONDUCTOR SYSTEM SELECTABLE TO CARRY A SINGLE SIGNAL OR INDEPENDENT SIGNALS

This application is a divisional of prior U.S. patent application Ser. No. 09/757,378 filed on Jan. 9, 2001 now U.S. Pat. No. 6,842,092, which is a continuation of prior U.S. patent application Ser. No. 09/127,050 filed Jul. 31, 1998 now abandoned.

TECHNICAL FIELD

The present invention relates to electrical and integrated circuits and, in particular, to an electrical conductor for an electrical and/or integrated circuit.

BACKGROUND

The transmission speed of an electrical signal along a conductor medium in an electrical circuit (including an integrated circuit and/or semiconductor device) is dependent on several factors. For a pulse transmitted through a conductor medium having a given length and wave velocity, the propagation delay of the pulse depends on the length of the medium and the wave velocity. The wave velocity, in turn, is related to the dielectric constant of the surrounding medium and the speed of light.

Another factor that delays the signal is caused by the resistance and capacitance of the conductor medium, commonly called the RC time constant. The speed of an electrical signal decreases when capacitance increases. Similarly, speed increases when capacitance decreases. The capacitance of the conductor medium depends on several factors, mainly the environment surrounding the conductor medium.

Accordingly, there exists a need for an apparatus and method for reducing the effective capacitance in a conductor of an electrical circuit thereby increasing the speed of an electrical signal transmitted along the conductor. Further, there is needed a conductor with relatively low capacitance for increasing the speed of an electrical signal transmitted therealong. Additionally, there is needed a method of constructing a conductor in an electrical circuit that reduces the capacitive effects surrounding the conductor and increases the speed of an electrical signal transmitted on the conductor.

SUMMARY OF THE INVENTION

According to the present invention, there is provided an apparatus for decreasing the propagation delay time of an electrical signal transmitted along a conductor in a circuit. The apparatus includes a first conductor having a length extending from a first area of the circuit to a second area of the circuit and for carrying the electrical signal. A second conductor located proximate the first conductor extends substantially parallel and along the first conductor, with the second conductor electrically coupled to the first conductor.

In another embodiment of the present invention, there is provided a conductor for transmitting a clocking signal from a first area to a second area of an integrated circuit. The conductor has a first elongated conductive portion extending from the first area to the second area and a second elongated conductive portion located proximate and spaced apart from the first conductive portion and extending substantially parallel with the first conductive portion. The conductor also includes a third elongated conductive portion located proximate and spaced apart from the first conductive portion and extending substantially parallel with the first conductive portion. The first conductive portion is electrically connected to the second conductive portion and the third conductive portion.

In yet another embodiment of the present invention, there is provided a method of forming an electrical conductor in a circuit that increases the speed of an electrical signal transmitted along the conductor. The method includes the steps of fabricating a first conductor having a length extending from a first area of the circuit to a second area of the circuit, and fabricating a second conductor proximate the first conductor and extending substantially parallel and along the first conductor, the second conductor electrically coupled to the first conductor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is made to the following description taken in conjunction with the accompanying drawings, wherein:

FIGS. 5A, 5B and 5C illustrate cross sectional views of different embodiments of the conductor of the present invention;

FIGS. 6B, 6C and 6D illustrate each of the configurations for the signal waveforms shown in FIG. 6A.

DETAILED DESCRIPTION OF THE INVENTION

Figure 1:
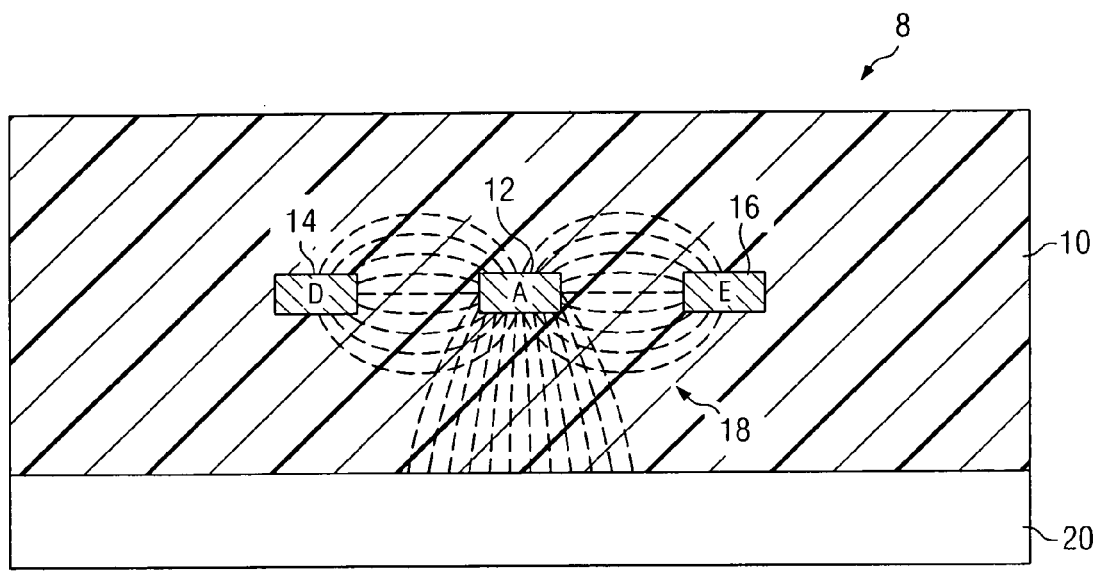
FIG. 1 is cross-sectional view of a semiconductor (or printed circuit board) substrate illustrating the capacitance between three signal lines (i.e., conductors) in the substrate according to the prior art.

With reference to the drawings, like reference characters designate like or similar elements throughout the drawings.

Now referring to FIG. 1, there is shown a cross-sectional view of a medium (semiconductor integrated circuit or printed circuit board, or the like) 8 according to the prior art having a substrate layer 20, an insulation layer 10, a first conductor 12 (also referenced as conductor A), a conductor 14 (also referenced as conductor D) and a conductor 16 (also referenced as conductor E) formed in the insulation layer 10. As will be appreciated, if the medium 8 is printed circuit board, the substrate layer 20 may not be present. FIG. 1 also shows capacitance paths 18 (illustrated in dotted lines) between the first conductor 12 and the conductors 14, 16. Additionally shown in FIG. 1 are the substrate layer 20 (which may include a conductive layer or other elements) and capacitance paths between the conductor 12 and the substrate layer 20. In addition, capacitance paths may exist between the conductor 12 and other elements or materials located proximate (above, beside, below) the conductor 12, but are not shown for convenience.

As will be appreciated, as the conductor 12 extends through the medium 8, many different conductors or elements having different (and dynamic) electrical signals thereon will be positioned proximate the conductor 12. These other conductors or elements couple capacitively to the conductor 12. It is readily understood that the amount of capacitive coupling depends on several factors, including the distance from the conductor 12, the length of the coupling region, the rate of change of the potential difference between conductor 12 and each proximate conductor, and the dielectric constant(s) of the material(s) therebetween. The total value of the capacitance is one factor that determines the "speed" and/or propagation delay of an electrical signal transmitted along the conductor 12. As the capacitance increases, the speed decreases (or propagation delay increases). Therefore, reducing the capacitance that an electrical signal "sees" as it propagates along the conductor 12 will increase its speed (or decrease its propagation delay).

In general terms, a signal on one conductor increasing in voltage while a signal on another conductor decreases in voltage (resulting in an increase in the voltage difference or "delta" voltage over time) generates the maximum capacitive effect, while two signals increasing (or decreasing) together generated the least capacitive effect. In other words, the capacitive effect is great between non-shielded conductor lines when both signals are active and opposite in direction. This effect remains substantial when one signal is active (increasing or decreasing) and the other signal is static (e.g., one signal is rising to a logic one and the other signal is held at a logic zero).

Figure 2:
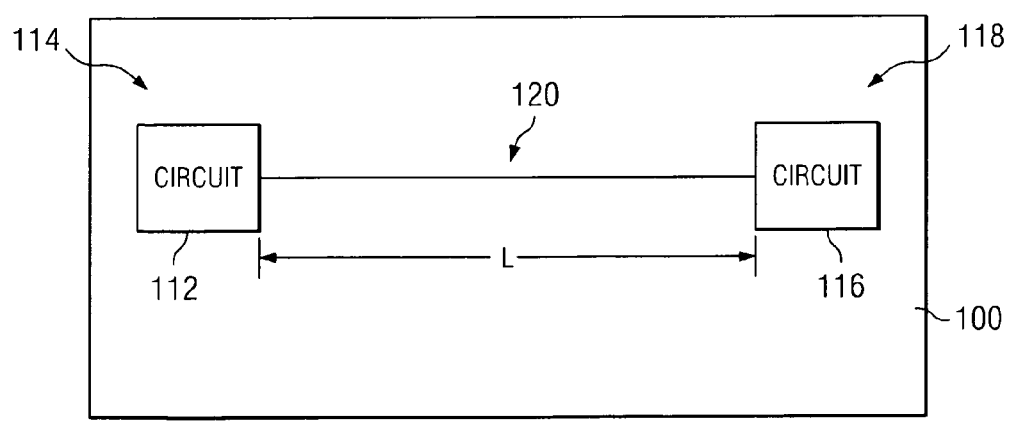
FIG. 2 is a diagram illustrating a conductor in accordance with the present invention.

Now referring to FIG. 2, there is illustrated a circuit 100 having a conductor 120 extending from a first circuit 112 located in a first area 114 of an integrated circuit 100 to a second circuit 116 located in a second area 118 of the integrated circuit 100. The conductor 120 has a length L, as shown in FIG. 2. The conductor 120 in accordance with the present invention reduces or decreases the propagation delay time (increases the speed) of an electrical signal transmitted along the conductor 120. As will be appreciated, the circuit 100 may also be any other electrical circuit, including a printed circuit board. Accordingly, the description of the present invention with respect to integrated circuits is also applicable to printed circuit boards and the like. In the preferred embodiment, the signal transmitted on the conductor 120 is a clocking signal and the propagation delay of the signal is reduced or decreased, thus increasing the speed of the signal.

To obtain most of the benefits and advantages of the present invention, the length L of the conductor 120 should be more than about 250 microns, and preferably about 1000 microns or more. As will be appreciated, when used in an integrated circuit, the length L will most likely be less than 50,000 microns, depending on the size of the integrated circuit substrate. The signal(s) transmitted on the conductor 120 are generally about 10 MHz or greater and, preferably, about 200 MHz or greater, to obtain the many advantages of the present invention.

Figure 3A:
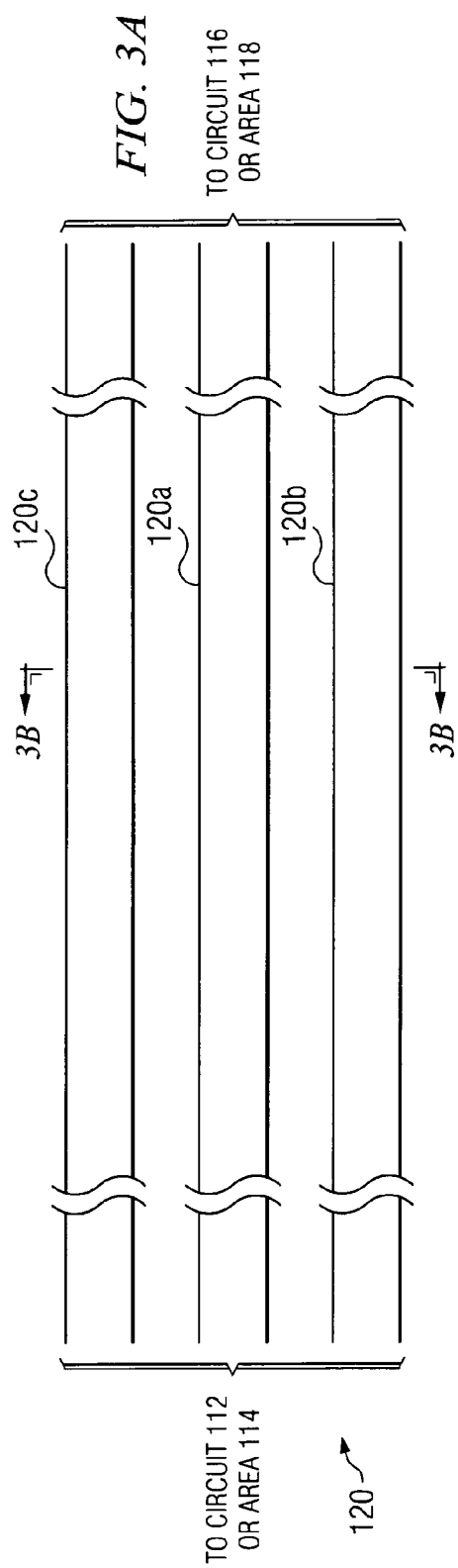
FIG. 3A is a more detailed diagram and top view of the conductor set forth in FIG. 2.

Now referring to FIG. 3A, there is illustrated a more detailed diagram of the conductor 120 of the present invention. The conductor 120 includes a first conductor 120a, a second conductor (or conductive portion) 120b extending substantially parallel and along the first conductor 120a, and a third conductor (or conductive portion) 120c extending substantially parallel and along the first conductor 120a. The conductors 120a, 120b, 120c are shown extending from the first circuit 112 (in the first area 114) to the second circuit 116 (in the second area 118) (see also FIG. 2). Each of the conductors 120a, 120b, 120c are made of any conductive metal or material, preferably of low resistance, including copper, tungsten, aluminum, polysilicon or other material, or combination thereof.

It will be understood that due to routing and process constraints and requirements, the additional conductor(s) may not run along the conductor 120a for the entire distance L, but instead substantial portions may run along the conductor 120a.

Figure 3B:
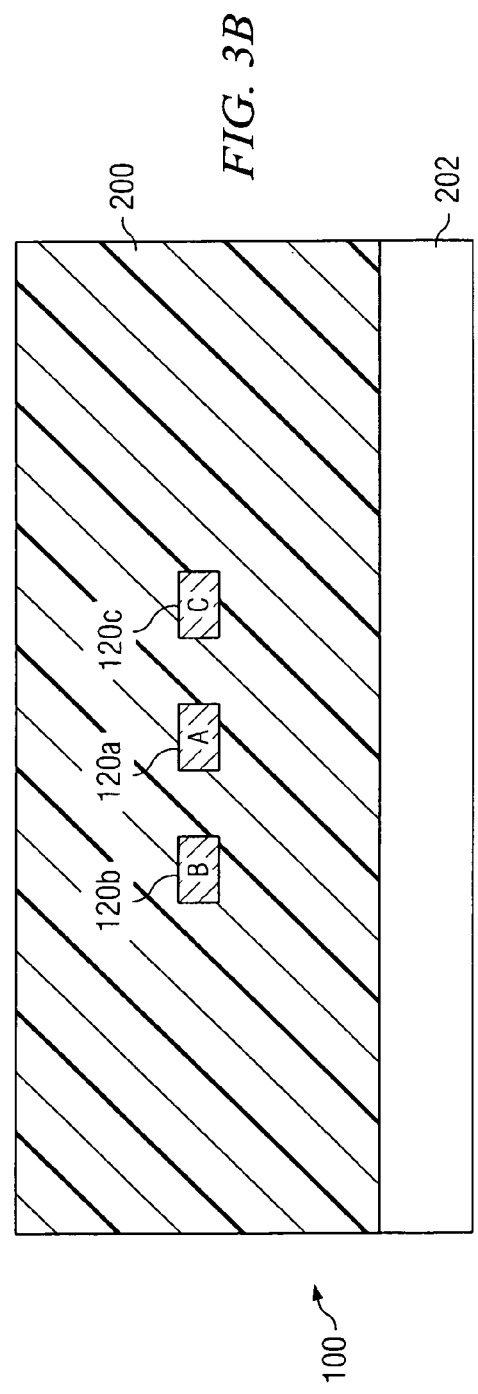
FIG. 3B is a cross-sectional view along line 3B-3B of FIG. 3A.

Now referring to FIG. 3B, there is shown a cross-sectional view cut along line 3B-3B of FIG. 3A. The conductors 120a (also referenced as conductor A), 120b (also referenced as conductor B), 120c (also referenced as conductor C) are formed in a insulating layer 200 (of an integrated circuit or printed circuit board, or the like). Additional layers of substrate may be provided, such as a substrate layer 202. The conductors 120b and 120c are each spaced apart substantially laterally from the conductor 120a, with the conductor 120b positioned along one side of the conductor 120a and the conductor 120c positioned along the other side of the conductor 120a. As will be appreciated, using present processes and methods, the width of each of the conductors is generally about 0.7 microns and the spacing therebetween is about 0.7 microns. However, the width and spacing dimensions may vary, and elements/dimensions in the figure may vary and may not be drawn to scale. It is expected that next generation processes will generate widths on the order of 0.2 to 0.4 microns, and perhaps even smaller.

Figure 4A:
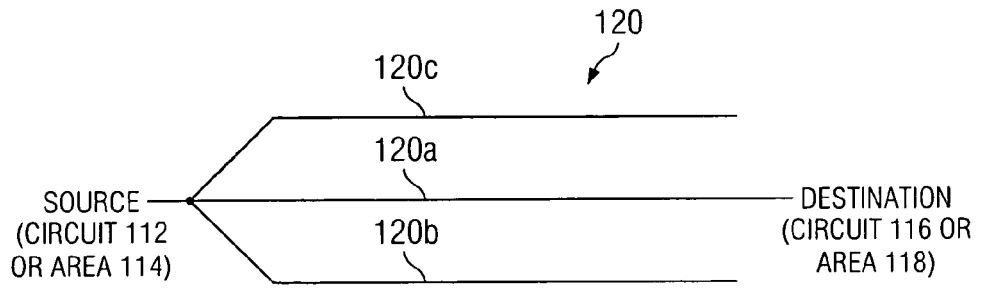
FIGS. 4A, 4B and 4C illustrate different configurations or embodiments of the conductor in accordance with the present invention.
Figure 4B:
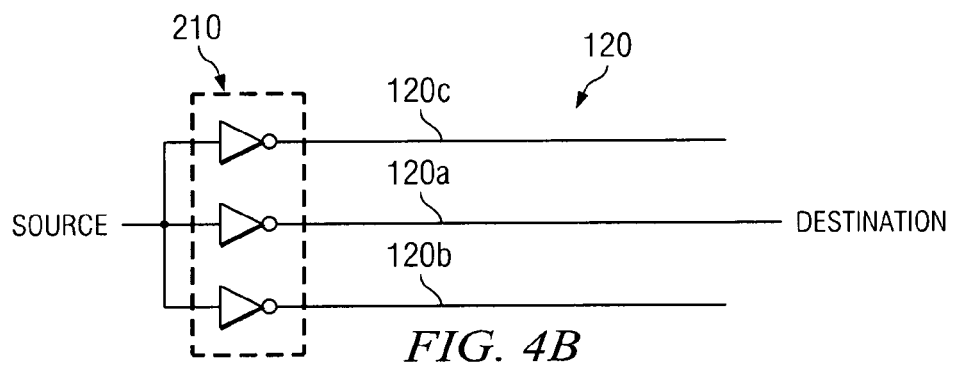
Figure 4C:
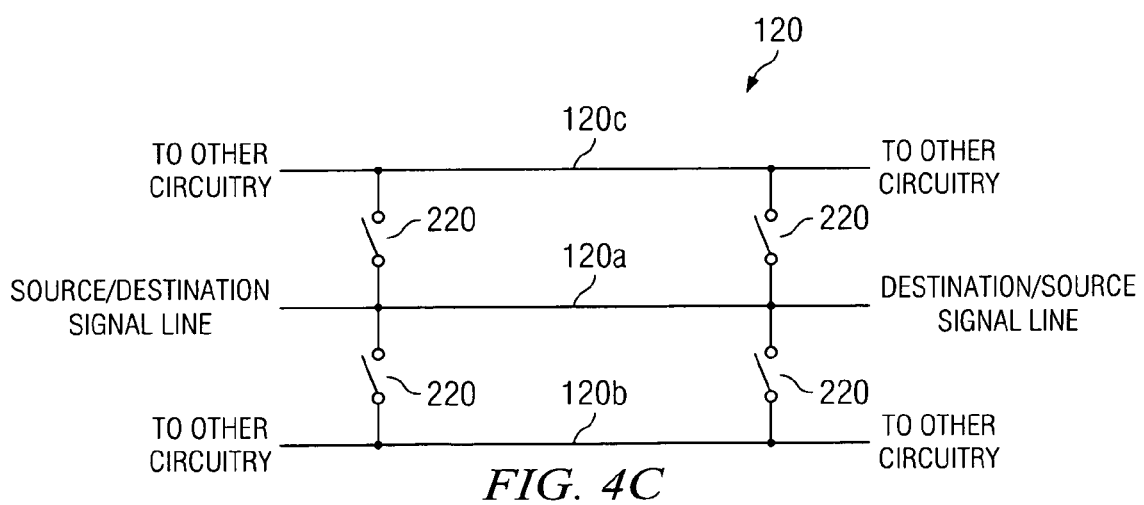

Now referring to FIGS. 4A-4C, there are illustrated different configurations or embodiments for electrically connecting the conductors 120b, 120c to the main conductor 120a. In FIG. 4A, the conductors 120a, 120b, 120c are electrically connected at or near the source end, as illustrated, using a conductive material, such as the material used to fabricate the conductors. It will be understood that the designations "source" and "destination" are used for convenience and illustrative purposes only, and that the designations could be switched, such that the source end may refer to the first circuit 112 or first area 114, or the second circuit 116 or second area 118. Moreover, the conductor 120 (or 120a) may be bi-directional, depending on the desired circuitry and functioning of the integrated circuit (or electrical circuit).

Now referring to FIG. 4B, there is illustrated another configuration or embodiment of the conductor 120 wherein the conductor 120a is electrically connected at one end to three separate drivers 210. Each driver 210 drives the respective conductors 120a, 120b, 120c. The drivers 210 may include any other type of circuitry, and are not limited to inverters.

Now referring to FIG. 4C, there is illustrated yet another configuration or embodiment of the conductor 120 wherein a plurality of switches 220 are used to electrically connect the conductor 120a to the conductor 120b, and to electrically connect the conductor 120a to the conductor 120c. The switches could also be tri-state devices. It will be understood to those skilled in the art that other circuits and methods may be used to electrically connect the conductor 120a to the conductors 120b, 120c.

As shown in FIG. 4C, the conductors 120b and 120c could also be utilized by other circuitry (connected as indicated in the figure by the label "TO OTHER CIRCUITRY") when the conductor 120a is not active, unused, or when a signal is transmitted whose speed or propagation delay is unimportant. This is accomplished using switches and/or tri-state devices with appropriate control lines, and can be implemented by those skilled in the art.

Now referring to FIGS. 5A-5C, there are shown cross-sectional views of several embodiments of the conductor 120 alternative to the embodiment shown in FIGS. 3A and 3B. In FIG. 5A, the conductor 120 includes a first conductor 120a, a second conductor (or conductive portion) 120b extending substantially parallel and along the first conductor 120a, and a third conductor (or conductive portion) 120c extending substantially parallel and along the first conductor 120a The conductors 120b and 120c are each spaced apart substantially vertically from the conductor 120a, with the conductor 120b positioned along the top side of the conductor 120a and the conductor 120c positioned along the bottom side of the conductor 120a.

Now referring to FIG. 5B, there is shown another alternative embodiment of the present invention that includes the features illustrated in FIGS. 3B and 5A. The conductor 120 includes a first conductor 120a and a plurality of conductors (or conductive portions) 120b, 120c, 120d, 120e, whereby the conductors 120b, 120c, 120d, 120e each extend substantially parallel and along the first conductor 120a. The conductors 120b and 120c are each spaced apart substantially laterally from the conductor 120a, with the conductor 120b positioned along one side of the conductor 120a and the conductor 120c positioned along the other side of the conductor 120a. The conductors 120d and 120e are each spaced apart substantially vertically from the conductor 120a, with the conductor 120d positioned along the top side of the conductor 120a and the conductor 120e positioned along the bottom side of the conductor 120a.

Now referring to FIG. 5C, there is shown yet another alternative embodiment of the present invention. The conductor 120 includes the conductors 120a, 120b, 120c, 120d, and 120e as set forth in FIG. 5B, and also includes a conductor 120f, a conductor 120g, a conductor 120h, and a conductor 120i, as shown in FIG. 5C.

Figure 6A:
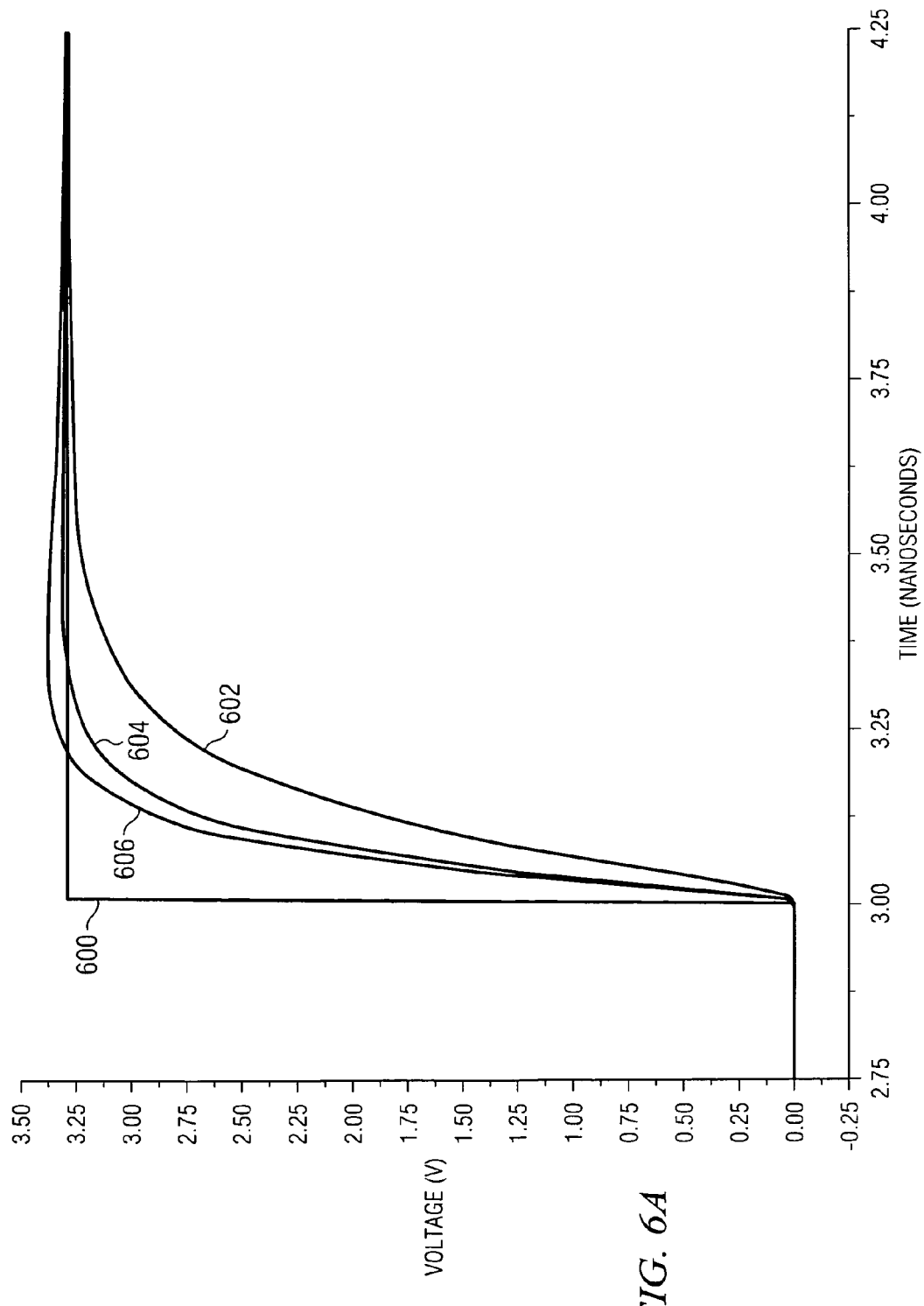
FIG. 6A is a graph illustrating the improvement in rise time (i.e. showing propagation delays) of a signal on a conductor in accordance with the present invention.

Now referring to FIGS. 6A-6D, there are shown in FIG. 6A signal waveforms in graphical representation illustrating rise times for a prior art conductor shown in FIG. 6B, for one embodiment of the present invention shown in FIG. 6C, and for another embodiment of the present invention shown in FIG. 6D.

In FIG. 6B, there is shown the prior art conductor 12 with additional conductors 14 and 16. The width of each conductor 12, 14, 16 is about 0.7 microns and the spacing therebetween is about 2.1 microns. The conductors 14 and 16 are not electrically connected to the conductor 12.

In FIG. 6C, there is shown one embodiment of the present invention having the conductor 120 including the conductor 120a and 120b. The width of each conductor 120a, 120b, 14, 16 is about 0.7 microns and the spacing between the conductors 14, 120b and 120a is about 0.7 microns while the spacing between the conductors 120a and 16 is about. 2.1 microns. The conductors 120a and 120b are electrically connected while the conductors 14 and 16 are not electrically connected to the conductor 120.

In FIG. 6D, there is shown one embodiment of the present invention having the conductor 120 including the conductors 120a, 120b and 120c. The width of each conductor 120a, 120b, 120c, 14, 16 is about 0.7 microns and the spacing therebetween is about 0.7 microns. The conductors 120a, 120b and 120c are electrically connected while the conductors 14 and 16 are not electrically connected to the conductor 120.

Now referring to FIG. 6A, there is shown a graph of voltage (volts) versus time (nanoseconds) comparing simulation results of the present invention with a prior art conductor. An ideal signal waveform for a signal transition from a logic zero (about 0 volts) to a logic one (about 3.3 volts) is identified by reference numeral 600, and illustrated with an instantaneous rise time. For the prior art conductor illustrated in FIG. 6B, the waveform of a signal on the conductor 12 is identified by reference numeral 602, with the conductors 14 and 16 held at a logic zero. As is shown, the prior art conductor 12 has a rise time (measured at about 90% of the logic one level of about 3.3 volts) of approximately 0.28 nanoseconds due to the capacitive effects of the conductors 14 and 16 on the conductor 12.

Now referring to two of the embodiments of the present invention as illustrated in FIGS. 6C and 6D, there is a substantial decrease in the rise time and corresponding decrease in the propagation delay (or increase in speed) for the conductor 120 of the present invention. As will be appreciated, the conductor 120a corresponds to the prior art conductor 12 shown in FIG. 6B. For the conductor 120 (including the conductors 120a and 120b) illustrated in FIG. 6C, the waveform of the signal on the conductor 120a is identified by reference numeral 604, with the conductors 14 and 16 held at a logic zero. As is shown, the conductor 120a has a rise time of approximately 0.16 nanoseconds due to the capacitive effects of the conductors 14 and 16 on the conductor 12. By adding the additional conductor 120b substantially parallel and along the conductor 120a, the conductor 120a is "shielded" from some of the capacitive effects of the conductors 14 and 16 on the conductor 120a. The conductor 120 results in an increase in speed and decrease in rise time (with a corresponding decrease in propagation delay) of a signal transmitted on the conductor 120.

For the conductor 120 (including the conductors 120a, 120b and 120c) illustrated in FIG. 6D, the waveform of the signal on the conductor 120a is identified by reference numeral 606, with the conductors 14 and 16 held at a logic zero. As is shown, the conductor 120a has a rise time of approximately 0.13 nanoseconds due to the capacitive effects of the conductors 14 and 16 on the conductor 120. By adding the additional conductors 120b and 120c substantially parallel and along the conductor 120a, the conductor 120a is "shielded" from some of the capacitive effects of the conductors 14 and 16 on the conductor 120a. The conductor 120 results in an increase in speed and decrease in rise time (with a corresponding decrease in propagation delay) of a signal transmitted on the conductor 120. The decrease/gain in rise time is about 0.15 nanoseconds. As shown, the decrease in rise time (increase in speed) is greater than a factor of two (and the corresponding reduction in propagation delay is greater than 50%).

As will be appreciated, the signal on the conductors 120b and 120c will have slower rise time in voltage at the end of the conductor line than the conductor 120a. It will also be understood that the advantages of the present invention are also present for decreases in voltage (fall time) and not limited to increases in voltage (rise time).

The capacitive effect (which causes delay) becomes greater as the dimensions of the integrated circuit (including printed circuit boards) decreases, and the next smaller generation of integrated circuits will incur a greater capacitive effect from line to line. Therefore, the present invention will be of increased benefit for future generation devices.

Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

The invention claimed is:

1. A method of operating a conductive structure for decreasing signal propagation delay, the conductive structure including first and second conductors substantially parallel to each other and at least one switch selectively connecting the first and second conductors the method comprising:

closing the at least one switch, thereby allowing the first and second conductors to carry a single signal; and opening the at least one switch, thereby allowing the first and second conductors to carry independent signals, wherein, when the at least one switch is closed, the conductive structure carries the single signal with reduced propagation delay and, when the at least one switch is opened, the conductive structure carries one or more of the independent signals without reduced propagation delay.

2. The method according to claim 1, wherein the second conductor is disposed proximate to and below the first conductor and a third conductor is disposed proximate to and above the first conductor.

3. The method according to claim 1, wherein closing the at least one switch when the first and second conductors carry the single signal further comprises:

closing both a first switch proximate a first end of the first and second conductors and a second switch proximate a second end of the first and second conductors when the first and second conductors carry the single signal.

4. A conductive structure for decreasing signal propagation delay, comprising:

a first conductor;

a second conductor substantially parallel to the first conductor;

a third conductor substantially parallel to the first conductor;

a first switch selectively connecting the first conductor to the second conductor, wherein the first and second conductors carry a single signal when the first switch is closed and are available to carry independent signals when the first switch is open; and a second switch selectively connecting the first conductor to the third conductor, wherein the first and third conductors carry the single signal when the second switch is closed and are available to carry independent signals when the second switch is open, wherein the second and third conductors decrease an effective capacitance of the first conductor when either or both of the first and second switches are closed, thereby decreasing propagation delay of the single signal.

5. The conductive structure in accordance with claim 4, wherein the second conductor is disposed proximate to and below the first conductor and the third conductor is disposed proximate to and above the first conductor.

6. The conductive structure in accordance with claim 4, wherein the first switch is located proximate to a first end the first conductor and a first end of the second conductor, wherein the second switch is located proximate to the first end of the first conductor and a first end of the third conductor, and wherein the conductive structure further comprises:

a third switch selectively connecting the first conductor to the second conductor, wherein the first and second conductors carry the single signal when the third switch is closed and are available to carry independent signals when the third switch is open, wherein the third switch is located proximate to a second end of the first conductor and a second end of the second conductor; and a fourth switch selectively connecting the first conductor to the third conductor, wherein the first and third conductors carry the single signal when the fourth switch is closed and are available to carry independent signals when the fourth switch is open, wherein the fourth switch is located proximate to the second end of the first conductor and a second end of the third conductor, wherein the second and third conductors decrease the effective capacitance of the first conductor when either or both of the third and fourth switches are closed, thereby decreasing propagation delay of the single signal.

7. A method of forming an electrical conductor in a circuit for increasing the speed of an electrical signal transmitted along the conductor, comprising the steps:

fabricating a first conductor having a length extending from a first area of the circuit to a second area of the circuit; and fabricating a second conductor proximate the first conductor and extending substantially parallel and along the first conductor, wherein the first conductor and the second conductor are electrically connected while the electrical signal is transmitted along the first conductor from the first area to the second area to decrease propagation delay of the electrical signal and the first and second conductors are electrically isolated from each other when independent electrical signals are transmitted on the first and second conductors.

* * * * *